United States Patent
Wang et al.

(10) Patent No.: US 11,948,616 B2
(45) Date of Patent: Apr. 2, 2024

(54) SEMICONDUCTOR STRUCTURE AND MANUFACTURING METHOD THEREOF

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Xiaoguang Wang, Hefei (CN); Dinggui Zeng, Hefei (CN); Huihui Li, Hefei (CN); Jiefang Deng, Hefei (CN); Kanyu Cao, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 163 days.

(21) Appl. No.: 17/808,404

(22) Filed: Jun. 23, 2022

(65) Prior Publication Data
US 2023/0154515 A1    May 18, 2023

Related U.S. Application Data

(63) Continuation of application No. PCT/CN2022/078678, filed on Mar. 1, 2022.

(30) Foreign Application Priority Data

Nov. 12, 2021    (CN) .......................... 202111338280.3

(51) Int. Cl.
*G11C 11/16*    (2006.01)
*H10B 61/00*    (2023.01)
(Continued)

(52) U.S. Cl.
CPC ........ *G11C 11/161* (2013.01); *G11C 11/1655* (2013.01); *H10B 61/22* (2023.02);
(Continued)

(58) Field of Classification Search
CPC .............. G11C 11/161; G11C 11/1655; G11C 11/1659; H10B 61/22; H10N 50/01; H10N 50/10; H10N 50/80
See application file for complete search history.

(56) References Cited

U.S. PATENT DOCUMENTS 8,111,540 B2    2/2012    Asao et al.
8,223,529 B2    7/2012    Kim et al.
(Continued)

FOREIGN PATENT DOCUMENTS

CN    101359503 A    2/2009
CN    102881823 A    1/2013
(Continued)

OTHER PUBLICATIONS

TW Office Action cited in TW111132158 dated Feb. 4, 2023, 7 pages.
(Continued)

*Primary Examiner* — Xiaochun L Chen
(74) *Attorney, Agent, or Firm* — Cooper Legal Group, LLC

(57) ABSTRACT

The present disclosure relates to a semiconductor structure and a manufacturing method thereof. The semiconductor structure includes: a substrate; a transistor, including a control terminal, a first terminal, and a second terminal; a first magnetic memory structure, a bottom electrode of which is electrically connected to the first terminal of the transistor; a second magnetic memory structure, a top electrode of which is electrically connected to the first terminal of the transistor, the bottom electrode of the first magnetic
(Continued)

memory structure is located in a same layer with a bottom electrode of the second magnetic memory structure; a first bit line, electrically connected to a top electrode of the first magnetic memory structure; a second bit line, electrically connected to the bottom electrode of the second magnetic memory structure; and a selection line, electrically connected to a second terminal of the transistor.

19 Claims, 8 Drawing Sheets

(51) Int. Cl.
  *H10N 50/01* (2023.01)
  *H10N 50/10* (2023.01)
  *H10N 50/80* (2023.01)
(52) U.S. Cl.
  CPC ............ *H10N 50/01* (2023.02); *H10N 50/10* (2023.02); *H10N 50/80* (2023.02)

(56) References Cited

U.S. PATENT DOCUMENTS

| | | | |
|---|---|---|---|
| 10,804,324 B1* | 10/2020 | Zhang | ................ H10N 70/8836 |
| 10,930,704 B2 | 2/2021 | Huang et al. | |
| 2007/0217254 A1 | 9/2007 | Matsuoka et al. | |
| 2008/0093592 A1 | 4/2008 | Moriya | |
| 2009/0267044 A1 | 10/2009 | Chang | |
| 2010/0142249 A1 | 6/2010 | Choi | |
| 2011/0241225 A1 | 10/2011 | Nagashima et al. | |
| 2013/0015421 A1 | 1/2013 | Sim et al. | |
| 2014/0065789 A1 | 3/2014 | Sasago et al. | |
| 2014/0204661 A1* | 7/2014 | Doyle | ................... H10N 50/80 365/158 |
| 2014/0241050 A1 | 8/2014 | Nakai et al. | |
| 2016/0042778 A1 | 2/2016 | Manipatruni et al. | |
| 2016/0322090 A1 | 11/2016 | Chan et al. | |
| 2020/0005863 A1 | 1/2020 | Grobis et al. | |
| 2020/0006627 A1 | 1/2020 | Manipatruni et al. | |
| 2020/0083286 A1 | 3/2020 | Manipatruni et al. | |
| 2020/0335696 A1 | 10/2020 | Fantini et al. | |
| 2022/0069011 A1 | 3/2022 | Ahn et al. | |
| 2023/0154515 A1 | 5/2023 | Wang et al. | |
| 2023/0171969 A1 | 6/2023 | Wang et al. | |

FOREIGN PATENT DOCUMENTS

| | | |
|---|---|---|
| CN | 102931206 A | 2/2013 |
| CN | 104081463 B | 6/2017 |
| CN | 110619908 A | 12/2019 |
| CN | 110943102 A | 3/2020 |
| CN | 112234077 A | 1/2021 |
| JP | 2004220759 A | 8/2004 |
| TW | 200832694 A | 8/2008 |
| WO | 2009084514 A1 | 7/2009 |

OTHER PUBLICATIONS

International Search Report cited in PCT/CN2022/099216 dated Dec. 21, 2022, 9 pages.
International Search Report cited in PCT/CN2022/078678 dated Jun. 22, 2022, 8 pages.
TW Office Action cited in TW111132089, dated May 15, 2023, 13 pages.
Non-Final Office Action cited in U.S. Appl. No. 17/809,642, dated Jan. 8, 2024, 21 pages.

* cited by examiner

US 11,948,616 B2

SEMICONDUCTOR STRUCTURE AND MANUFACTURING METHOD THEREOF

CROSS-REFERENCE TO RELATED APPLICATIONS

The present disclosure is a continuation application of International Patent Application No. PCT/CN2022/078678, titled "SEMICONDUCTOR STRUCTURE AND MANUFACTURING METHOD THEREOF" and filed on Mar. 1, 2022, which claims the priority to Chinese Patent Application 202111338280.3, titled "SEMICONDUCTOR STRUCTURE AND MANUFACTURING METHOD THEREOF" and filed with China National Intellectual Property Administration (CNIPA) on Nov. 12, 2021. The entire contents of International Patent Application No. PCT/CN2022/078678 and Chinese Patent Application 202111338280.3 are incorporated herein by reference.

TECHNICAL FIELD

The present disclosure relates to the technical field of integrated circuits, and in particular to a semiconductor structure and a manufacturing method thereof.

BACKGROUND

A magnetoresistive random access memory (MRAM) includes a plurality of memory elements with magnetoresistive effects, such as giant magneto resistance (GMR) or tunneling magnetoresistance (TMR), and data states of the memory elements can be written or read.

Currently, the most common internal combination of the MRAM is 1transistor-1magnetic tunnel junction (1T-1MTJ) cells. 1T-1MTJ has the advantages of small area, low manufacturing cost, and good integration with a complementary metal-oxide semiconductor (CMOS) process.

However, 1T-1MTJ has the disadvantage of small read margin because a reference signal needs to be provided. How to improve the read margin of the MRAM is an urgent problem to be solved.

SUMMARY

According to some embodiments, an aspect of the present disclosure provides a semiconductor structure, including:
  a substrate;
  a transistor, including a control terminal, a first terminal, and a second terminal, where the first terminal and the second terminal are located in the substrate, and the control terminal is located between the first terminal and the second terminal;
  a first magnetic memory structure, where a bottom electrode of the first magnetic memory structure is electrically connected to the first terminal of the transistor;
  a second magnetic memory structure, where a top electrode of the second magnetic memory structure is electrically connected to the first terminal of the transistor, and the bottom electrode of the first magnetic memory structure is located in a same layer with a bottom electrode of the second magnetic memory structure;
  a first bit line, electrically connected to a top electrode of the first magnetic memory structure;
  a second bit line, electrically connected to the bottom electrode of the second magnetic memory structure; and
  a selection line, electrically connected to a second terminal of the transistor.

Another aspect of the present disclosure further provides a manufacturing method of a semiconductor structure, including:
  providing a substrate;
  forming a transistor, where the transistor includes a first terminal and a second terminal that are located in the substrate, and a control terminal located between the first terminal and the second terminal;
  forming a first magnetic memory structure, a second magnetic memory structure, a first bit line, and a second bit line, where a bottom electrode of the first magnetic memory structure is electrically connected to the first terminal of the transistor, a top electrode of the second magnetic memory structure is electrically connected to the first terminal of the transistor, the first bit line is electrically connected to a top electrode of the first magnetic memory structure, the second bit line is electrically connected to a bottom electrode of the second magnetic memory structure, and the bottom electrode of the first magnetic memory structure is located in a same layer with the bottom electrode of the second magnetic memory structure; and
  forming a selection line electrically connected to a second terminal of the transistor.

BRIEF DESCRIPTION OF THE DRAWINGS

To describe the technical solutions in the embodiments of the present disclosure or in the conventional art more clearly, the following briefly describes the accompanying drawings required for describing the embodiments or the conventional art. Apparently, the accompanying drawings in the following description show merely some embodiments of the present disclosure, and a person of ordinary skill in the art may still derive other accompanying drawings from these accompanying drawings without creative efforts.

FIG. 11 to FIG. 12 are schematic cross-sectional views of a structure obtained in step S37 to step S38 in the manufacturing method of a semiconductor structure according to is an embodiment of the present disclosure, in which FIG. 12 is also a schematic cross-sectional view of a semiconductor structure according to an embodiment of the present disclosure.

DETAILED DESCRIPTION

Figure 1:
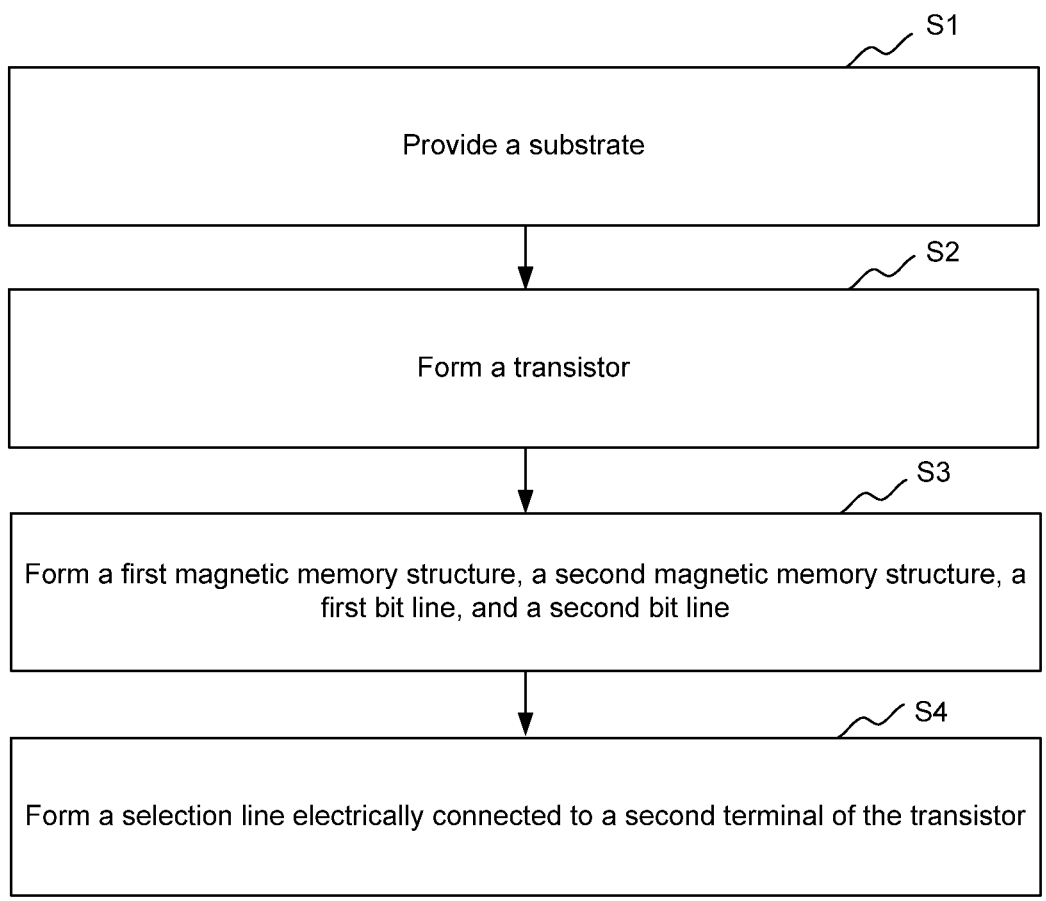
FIG. 1 is a flowchart of a manufacturing method of a semiconductor structure according to an embodiment of the present disclosure.

To facilitate the understanding of the present disclosure, the present disclosure will be described more completely below with reference to the accompanying drawings. Preferred embodiments of the present disclosure are shown in the accompanying drawings. However, the present application may be embodied in various forms without being limited to the embodiments described herein. On the contrary, these embodiments are provided to make the present application more thorough and comprehensive.

Unless otherwise defined, all technical and scientific terms used herein have the same meaning as commonly understood by those skilled in the technical field of the present disclosure. The terms used in the specification of the present disclosure are merely for the purpose of describing specific embodiments, rather than to limit the present disclosure.

It should be understood that when an element or a layer is described as "being on" or "being electrically connected to" another element or layer, it can be on or electrically connected to the another element or layer directly, or an intervening element or layer may be present. It should be understood that although terms such as first, second, and third may be used to describe various elements, components, regions, layers, doping types and/or sections, these elements, components, regions, layers, doping types and/or sections should not be limited by these terms. These terms are only used to distinguish one element, component, region, layer, doping type or section from another element, component, region, layer, doping type or section. Therefore, without departing from the teachings of the present disclosure, a first element, component, region, layer, doping type or section discussed below may be a second element, component, region, layer, doping type or section. For example, a first magnetic memory structure may be a second magnetic memory structure, and similarly, the second magnetic memory structure may be the first magnetic memory structure; the first magnetic memory structure and the second magnetic memory structure are different magnetic memory structures, for example, the first magnetic memory structure may be used as a reference unit and the second magnetic memory structure may be used as a data unit, or the first magnetic memory structure may be used as a data unit and the second magnetic memory structure may be used as a reference unit.

Spatial relationship term such as "located above" can be used herein to describe the relationship shown in the figure between one element or feature and another element or feature. It should be understood that in addition to the orientations shown in the figure, the spatial relationship terms further include different orientations of used and operated devices. For example, if a device in the accompanying drawings is turned over and described as being "located above" another element or feature, the device is oriented "under" the another element or feature. Therefore, the exemplary term "located above" may include two orientations of above and below. In addition, the device may further include other orientations (for example, a rotation by 90 degrees or other orientations), and the spatial description used herein is interpreted accordingly.

In the specification, the singular forms of "a pair" and "the/this" may also include plural forms, unless clearly indicated otherwise. It should also be understood that term "include", when used in this specification, may determine the presence of features, integers, steps, operations, elements and/or components, but does not exclude the presence or addition of one or more other features, integers, steps, operations, elements, components and/or groups. In this case, in this specification, the term "and/or" includes any and all combinations of related listed items.

Embodiments of the present disclosure are described herein with reference to cross-sectional views as schematic diagrams of idealized embodiments (and intermediate structures) of the present disclosure, such that variations shown in the shapes and due to, for example, manufacturing techniques and/or tolerances can be contemplated. Therefore, the embodiments of the present disclosure should not be limited to the specific shapes of the regions shown herein, but include shape deviations due to, for example, manufacturing technology. The regions shown in the figure are schematic in nature, and their shapes are not intended to show the actual shapes of the regions of the device and do not limit the scope of the present disclosure.

With reference to FIG. 1, a manufacturing method of a semiconductor structure provided in the present disclosure includes the following steps:

S1: Provide a substrate.

S2: Form a transistor. Specifically, the transistor may include a first terminal and a second terminal that are located in the substrate, and a control terminal located between the first terminal and the second terminal.

S3: Form a first magnetic memory structure, a second magnetic memory structure, a first bit line, and a second bit line. Specifically, a bottom electrode of the first magnetic memory structure is electrically connected to the first terminal of the transistor, a top electrode of the second magnetic memory structure is electrically connected to the first terminal of the transistor, the first bit line is electrically connected to a top electrode of the first magnetic memory structure, a second bit line is electrically connected to a bottom electrode of the second magnetic memory structure, and the bottom electrode of the first magnetic memory structure is located in a same layer with the bottom electrode of the second magnetic memory structure.

S4: Form a selection line electrically connected to the second terminal of the transistor.

The disclosure is related to Phase Change Random Access Memory (PCRAM) technology, especially to PCRAM 1T2R write/read operation design resolving its read margin issue. By utilizing 1T2R pair-bit design and write/read scheme, the invention can be applied in PCRAM wide applications.

PCRAM storage cell is constituted by a thin-film PCM layer (i.e., GeSbTe) in contact with a metallic heater. The PCM can be changed from low resistive (crystalline) to high resistive (amorphous) state (RESET) and vice versa, from high resistive (amorphous) to low resistive (crystalline) state named as SET operation. The spreads in cell physical parameters lead to a reduced spacing between SET and RESET distribution, thus, to a decreased safe margin for read operation.

1. PCRAM SET/RESET resistance tail bits exists due to process variations,
2. The spreads in PCRAM cell physical parameters lead to a reduced safe margin for read operation.
3. Write error detection or storage data degradation/disturb sense.

For 1T1R, in general, bit operation window relies on tail bit, which comes from bit-2-bit variation; 1T2R pair-bit design includes one data bit and one reference bit; 1T2R pair-bit operation: WRITE reference bit to reversed status of the paired data bit, and READ data bit with comparing to paired reference bit, thus, the tail bit effect doesn't impact read margin any more, since even tail bit has a paired reference bit; Memory density is scarified due to the additional reference bit, however, high volume memory would be achieved reliably; by developing PCRAM technology upon DRAM 1×nm platform. Comparator instead of Sense Amplifier could be used for the pair-bit design, thus the sensing area efficiency improved together with sensing reliability.

In the manufacturing method of a semiconductor structure provided by the present disclosure, a complementary structure consisting of two magnetic memory structures is formed. The first magnetic memory structure and the second magnetic memory structure may be constantly configured in complementary states (for example, the first magnetic memory structure is in a parallel state RP and the second magnetic memory structure is in an antiparallel state RAP, and vice versa), so that the manufactured semiconductor structure does not need any external reference signal, thus achieving a high read speed, a large read margin, and high reliability. Meanwhile, because the bottom electrode of the first magnetic memory structure is in the same layer with the bottom electrode of the second magnetic memory structure, during manufacturing, the bottom electrode of the first magnetic memory structure and the bottom electrode of the second magnetic memory structure can be formed simultaneously in one process step, which reduces the process steps and the cost.

For example, when the first magnetic memory structure is used as a reference unit and the second magnetic memory structure is used as a data unit, the data unit, that is, a reverse state of the second magnetic memory structure, can be written to the reference unit, that is, the first magnetic memory structure, and compared with the paired reference units to read the data bits. In this way, the impact of the tailing bit effect on the read margin can be reduced.

The manufacturing method of a semiconductor structure provided by some embodiments of the present disclosure will be described below in a more detailed way with reference to FIG. 2 to FIG. 12.

For step S1, the present disclosure does not limit the material of the substrate provided in step S1. For example, the material of the substrate may include, but not limited to, sapphire, silicon carbide (SiC), silicon (Si) or gallium nitride (GaN), etc.

For step S2, the first terminal and the second terminal in the manufacturing method of a semiconductor structure provided by the present disclosure may include a drain doped region and a source doped region; in addition, a conductive type of the drain doped region may be the same as or different from that of the source doped region, which is not limited in the present disclosure.

It may be understood that, all transistors mentioned in the present disclosure may include, but are not limited to, a field effect transistor, an insulated gate bipolar transistor, or the like, and the specific type of the transistor is not limited in the present disclosure.

For step S3 and step S4, referring to FIG. 2 to FIG. 12, in an embodiment, step S3 may specifically include the following steps:

S31: Form a first dielectric layer 301, where the first dielectric layer 301 covers a transistor 2.

Figure 3:
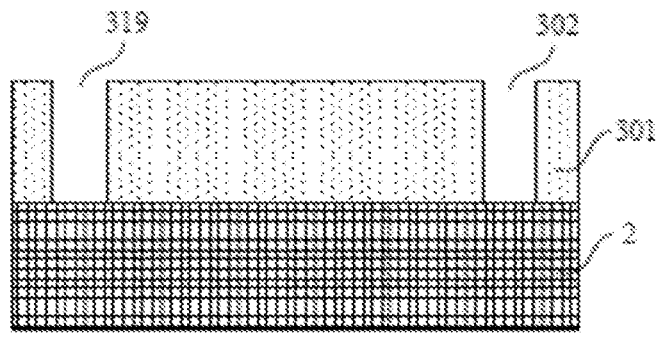
FIG. 3 is a schematic cross-sectional view of a structure obtained in step S32 in the manufacturing method of a semiconductor structure according to an embodiment of the present disclosure.

S32: As shown in FIG. 3, form a first interconnecting hole 302 in the first dielectric layer 301, where the first interconnecting hole 302 exposes a first terminal (not marked in FIG. 3) of the transistor 2.

Figure 4:
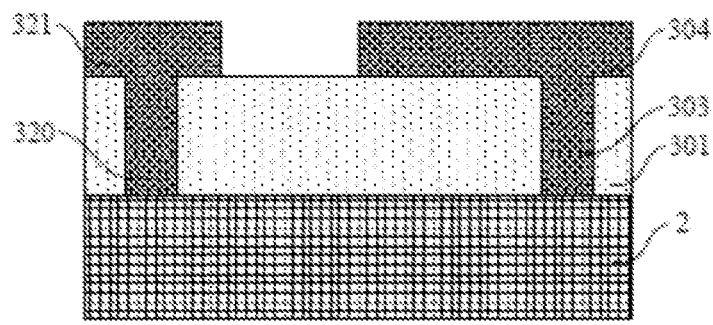
FIG. 4 is a schematic cross-sectional view of a structure obtained in step S33 in the manufacturing method of a semiconductor structure according to an embodiment of the present disclosure.

S33: As shown in FIG. 4, form a first interconnecting structure 303 in the first interconnecting hole 302, and form a first conductor layer 304 on an upper surface of the first dielectric layer 301, where the first conductor layer 304 is electrically connected to the first terminal of the transistor 2 through the first interconnecting structure 303.

Figure 6:
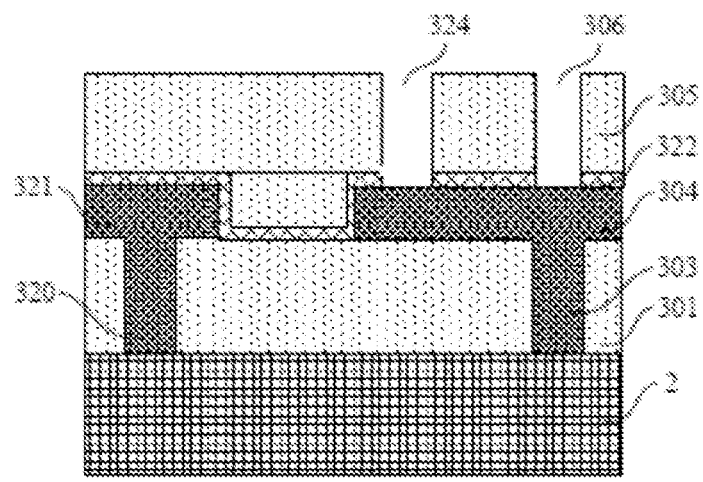
FIG. 6 is a schematic cross-sectional view of a structure obtained in step S34 in the manufacturing method of a semiconductor structure according to an embodiment of the present disclosure.

S34: As shown in FIG. 6, form a second dielectric layer 305 on the first dielectric layer 301, and form a second interconnecting hole 306 in the second dielectric layer 305, where the second interconnecting hole 306 exposes the first conductor layer 304.

Figure 7:
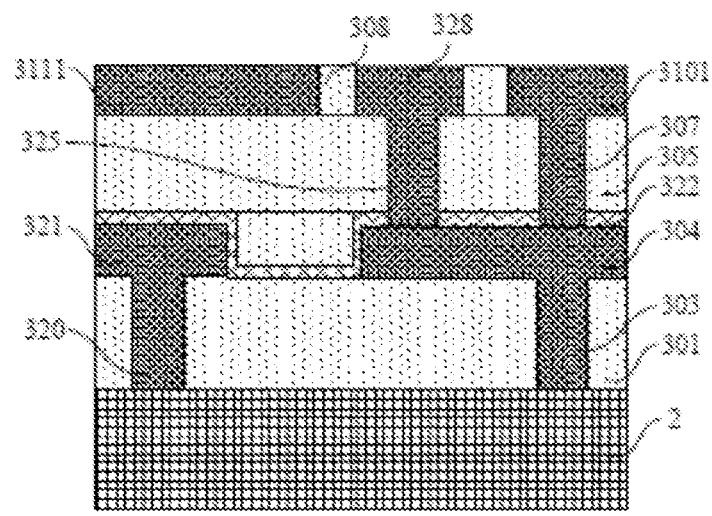
FIG. 7 is a schematic cross-sectional view of a structure obtained in step S361 to step S362 in the manufacturing method of a semiconductor structure according to an embodiment of the present disclosure.

S35: As shown in FIG. 7, form a second interconnecting structure 307 in the second interconnecting hole 306.

S36: As shown in FIG. 7 to FIG. 10, form a third dielectric layer 308, a first magnetic memory structure 310, a second magnetic memory structure 311, and a fourth dielectric layer 309 on the second dielectric layer 305, where a bottom electrode 3101 of the first magnetic memory structure 310 is connected to the first conductor layer 304 through the second interconnecting structure 307.

Figure 11:
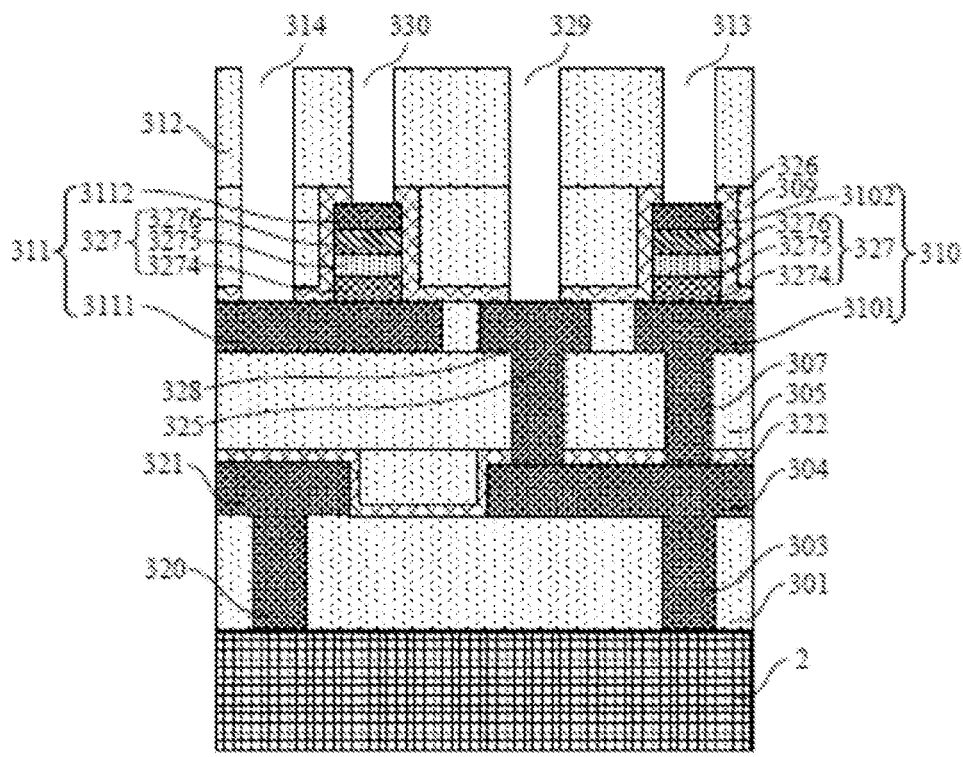

S37: As shown in FIG. 11, form a fifth dielectric layer 312 on the fourth dielectric layer 309, form a third interconnecting hole 313 in the fifth dielectric layer 312, and form a fourth interconnecting hole 314 in the fifth dielectric layer 312 and the fourth dielectric layer 309, where the third interconnecting hole 313 exposes a top electrode 3102 of the first magnetic memory structure 310, and the fourth interconnecting hole 314 exposes a bottom electrode 3111 of the second magnetic memory structure 311.

Figure 12:
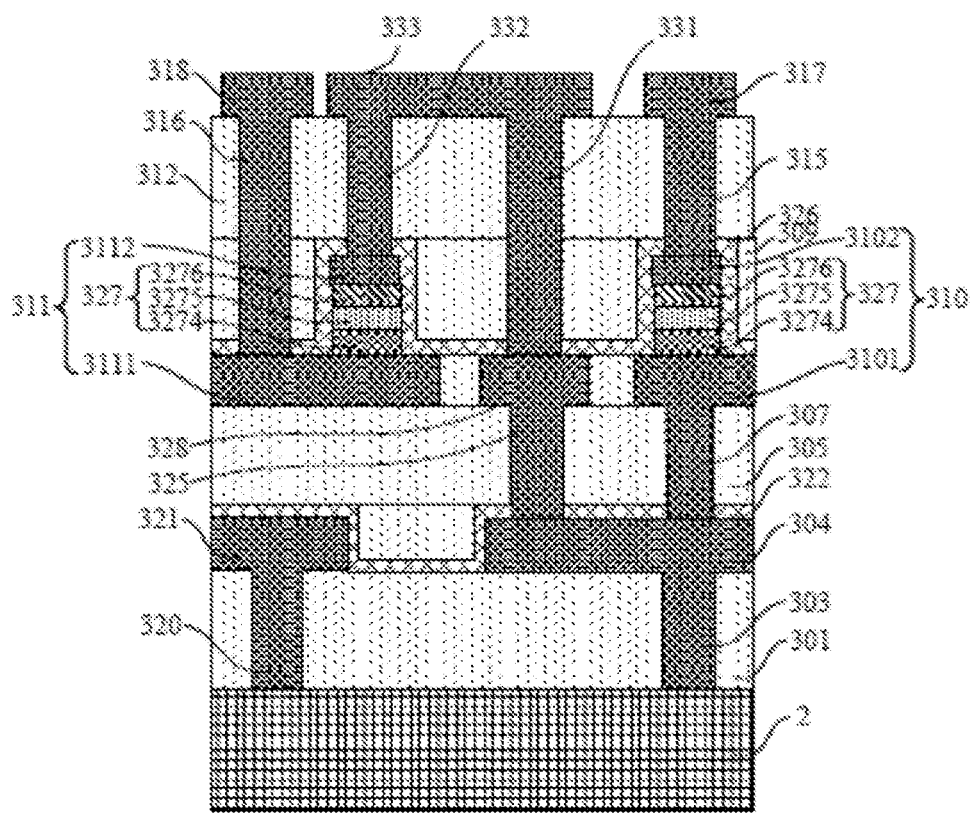

S38: As shown in FIG. 12, form a third interconnecting structure 315 in the third interconnecting hole 313, form a fourth interconnecting structure 316 in the fourth interconnecting hole 314, and form a first bit line 317 and a second bit line 318 on the fifth dielectric layer 312, where the first bit line 317 is electrically connected to the top electrode 3102 of the first magnetic memory structure 310 through the third interconnecting structure 315, and the second bit line 318 is electrically connected to the bottom electrode 3111 of the second magnetic memory structure 311 through the fourth interconnecting structure 316.

For step S32 and step S33, in an embodiment, the control terminal of the transistor 2 is a gate, the first terminal of the transistor 2 is a drain, the second terminal of the transistor 2 is a source, the selection line 321 is a source line, and the first conductor layer 304 is a drain line. Based on the foregoing embodiment, as shown in FIG. 3, while the first interconnecting hole 302 is formed in the first dielectric layer 301 in step S32, an eighth interconnecting hole 319 is further formed in the first dielectric layer 301, where the eighth interconnecting hole 319 exposes the second terminal (not marked in FIG. 3) of the transistor 2. Based on the foregoing step, as shown in FIG. 4, while the first interconnecting structure 303 is formed in the first interconnecting hole 302 in step S33, an eighth interconnecting structure 320 is further formed in the eighth interconnecting hole 319; while the first conductor layer 304 is formed on the upper surface of the first dielectric layer 301, a source line is further formed on the upper surface of the first dielectric layer 301, where the source line is electrically connected to the second terminal of the transistor 2 through the eighth interconnecting structure 320, and a gap exists between the source line and the first conductor layer 304.

In the manufacturing method of a semiconductor structure provided by the foregoing embodiment, an eighth interconnecting hole is formed while the first interconnecting hole is formed, and an eighth interconnecting structure is formed while the first interconnecting structure is formed. The eighth interconnecting structure may be used as a source contact structure to electrically connect the source line to the second terminal of the transistor. In this way, during manufacturing, the first interconnecting hole and the eighth interconnecting hole can be formed simultaneously in one process step; the first interconnecting structure and the eighth interconnecting structure can be formed simultaneously in one process step, thereby further reducing the process steps and the Cost.

Figure 5:
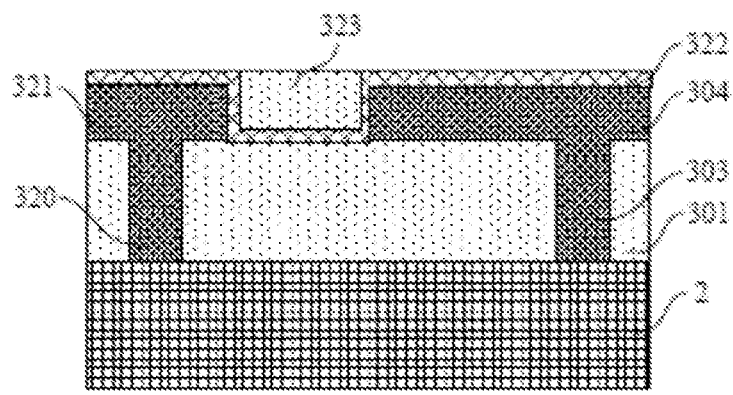
FIG. 5 is a schematic cross-sectional view of a structure obtained by forming an etching stop layer on a source line, a first conductor layer, and an exposed portion of a first dielectric layer in the manufacturing method of a semiconductor structure according to an embodiment of the present disclosure.

In an embodiment, referring to FIG. 5, after the step of forming a first conductor layer 304 and a source line and before step S34 of forming a second dielectric layer 305, the method may further include a step of forming an etching stop layer 322. Specifically, after the step of forming a first conductor layer 304 and a source line and before step S34 of forming a second dielectric layer 305, the etching stop layer 322 may further be formed on the source line, the first conductor layer 304, and an exposed portion of the first dielectric layer 301.

The present disclosure does not limit the specific material of the etching stop layer 322. The material of the etching stop layer 322 may include, but is not limited to, silicon, silicon carbide, silicon nitride (SiN) or silicon oxynitride (SiON), etc. In an embodiment, the material of the etching stop layer 322 includes silicon nitride.

More specifically, in an embodiment, further referring to FIG. 5, after the step of forming an etching stop layer 322 and before step S34 of forming a second dielectric layer 305, a dielectric filler layer 323 may further be formed on an upper surface of the etching stop layer 322 between the source line and the first conductor layer 304, where the gap between the source line and the first conductor layer 304 is filled with the dielectric filler layer 323.

In the present disclosure, the specific manners of forming the first dielectric layer 301, forming the second dielectric layer 305, and forming the sequentially stacked third dielectric layer 308 and fourth dielectric layer 309, forming the fifth dielectric layer 312, and forming the dielectric filler layer 323 are not limited. The first dielectric layer 301, the second dielectric layer 305, the third dielectric layer 308, the fourth dielectric layer 309, the fifth dielectric layer 312, and the dielectric filler layer 323 may be formed through deposition in, but not limited to, the following manners: atmospheric pressure chemical vapor deposition (APCVD), low pressure chemical vapor deposition (LPCVD), plasma-enhanced chemical vapor deposition (PECVD), high-density plasma chemical vapor deposition (HDP-CVD), radical-enhanced chemical vapor deposition (RECVD), atomic layer deposition (ALD), and the like.

The present disclosure does not limit the specific materials of the first dielectric layer 301, the second dielectric layer 305, the third dielectric layer 308, the fourth dielectric layer 309, the fifth dielectric layer 312, and the dielectric filler layer 323. The first dielectric layer 301, the second dielectric layer 305, the third dielectric layer 308, the fourth dielectric layer 309, the fifth dielectric layer 312, and the dielectric filler layer 323 each may include, but are not limited to, silicon, silicon nitride (SiN), silicon oxide ($SiO_2$) or silicon oxynitride (SiON), etc. In an embodiment, the first dielectric layer 301, the second dielectric layer 305, the third dielectric layer 308, the fourth dielectric layer 309, the fifth dielectric layer 312, and the dielectric filler layer 323 each include silicon nitride.

For step S34 and step S35, referring to FIG. 6 and FIG. 7, in an embodiment, as shown in FIG. 6, while the second interconnecting hole 306 is formed in the second dielectric layer 305 in step S34, a fifth interconnecting hole 324 is further formed in the second dielectric layer 305. Based on the foregoing step, as shown in FIG. 7, while the second interconnecting structure 307 is formed in the second interconnecting hole 306 in step S35, a fifth interconnecting structure 325 is further formed in the fifth interconnecting hole 324.

In the manufacturing method of a semiconductor structure provided by the foregoing embodiment, a fifth interconnecting hole is formed while the second interconnecting hole is formed, and a fifth interconnecting structure is formed while the second interconnecting structure is formed. In this way, during manufacturing, the second interconnecting hole and the fifth interconnecting hole can be formed simultaneously in one process step; the second interconnecting structure and the fifth interconnecting structure can be formed simultaneously in one process step, thereby further reducing the process steps and the cost.

Figure 8:
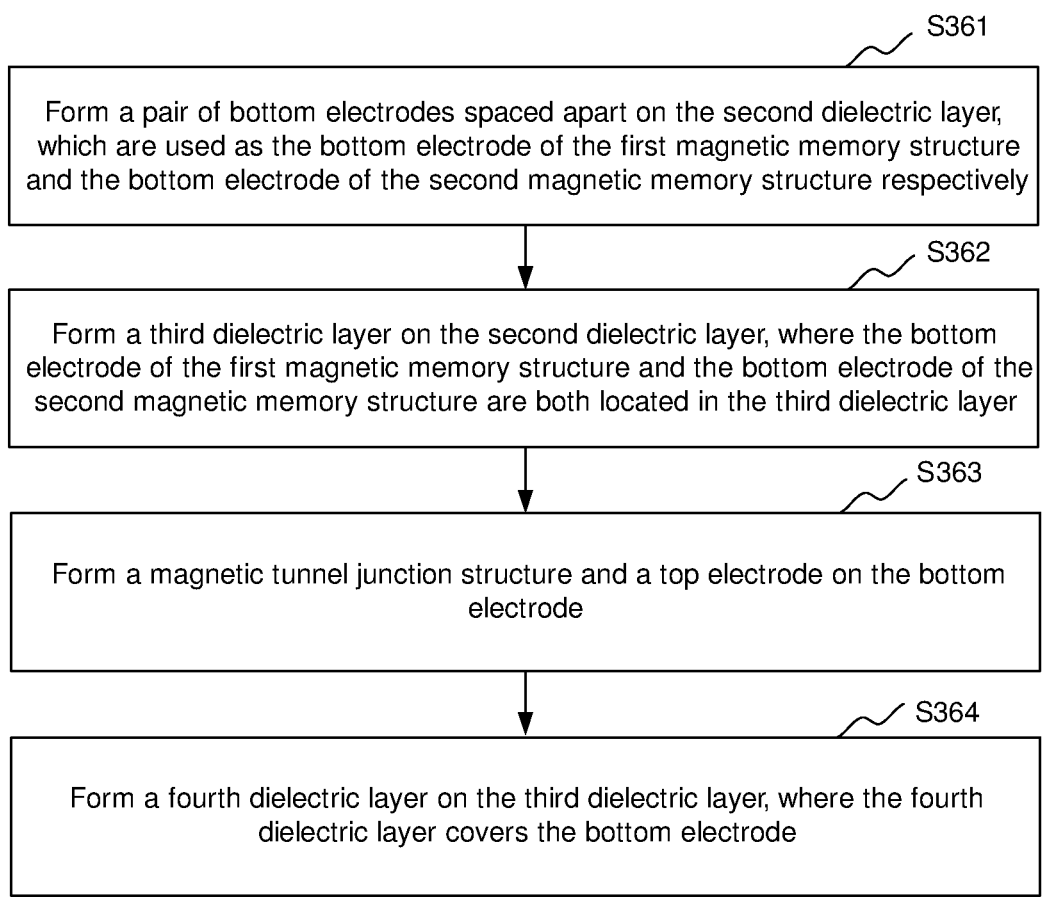
FIG. 8 is a flowchart of step S36 in the manufacturing method of a semiconductor structure according to an embodiment of the present disclosure.

For step S36, referring to FIG. 7 to FIG. 10 in conjunction with FIG. 8, in an embodiment, step S36 may specifically include the following steps:

S361: As shown in FIG. 7, form a pair of bottom electrodes spaced apart on the second dielectric layer 305, which are used as the bottom electrode 3101 of the first magnetic memory structure 310 and the bottom electrode 3111 of the second magnetic memory structure 311 respectively.

S362: As shown in FIG. 7, form a third dielectric layer 308 on the second dielectric layer 305, where the bottom electrode 3101 of the first magnetic memory structure 310 and the bottom electrode 3111 of the second magnetic memory structure 311 are both located in the third dielectric layer 308.

Figure 9:
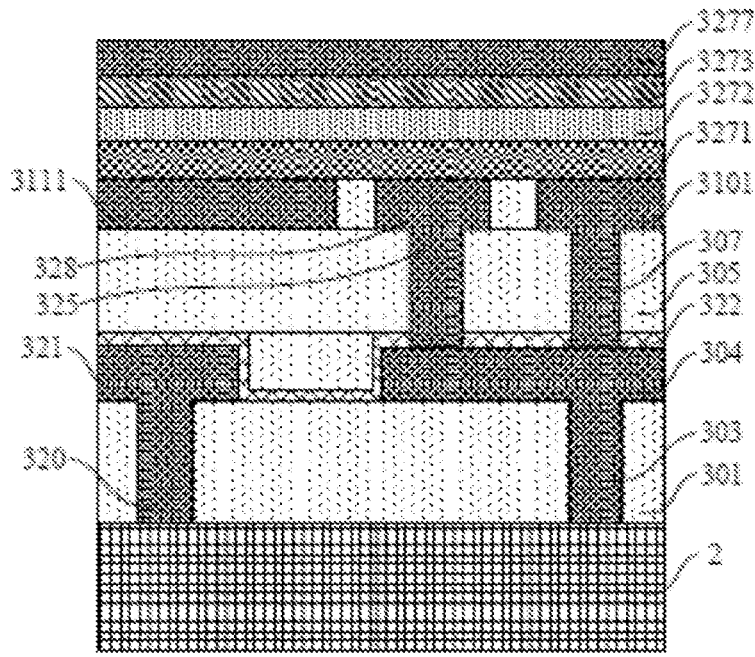
FIG. 9 is a schematic cross-sectional view of a structure obtained by forming, on an upper surface of a bottom electrode, a fixed material layer, a magnetic tunnel junction material layer, and a free material layer that are sequentially stacked from bottom to top in the manufacturing method of a semiconductor structure according to an embodiment of the present disclosure.
Figure 10:
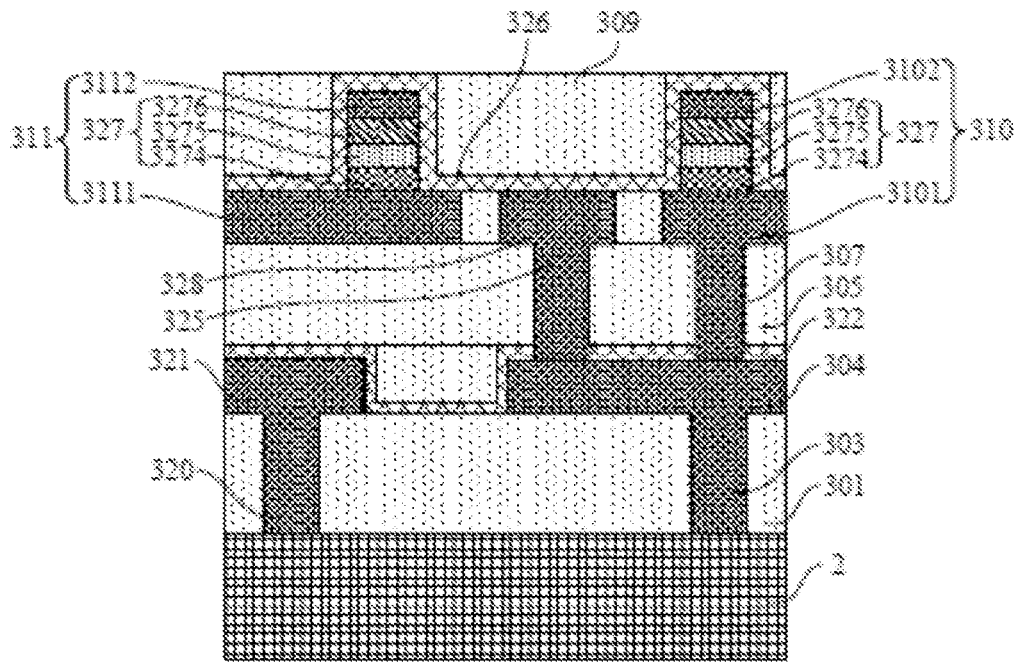
FIG. 10 is a schematic cross-sectional view of a structure obtained in step S36 in the manufacturing method of a semiconductor structure according to an embodiment of the present disclosure.

S363: As shown in FIG. 9 and FIG. 10, form a magnetic tunnel junction structure 327 and a top electrode on the bottom electrode.

S364: As shown in FIG. 10, form a fourth dielectric layer 309 on the third dielectric layer 308, where the fourth dielectric layer 309 covers the bottom electrode.

It should be noted that, step S363 may specifically include: forming, on the bottom electrode 3101 of the first magnetic memory structure 310, the magnetic tunnel junction structure 327 in the first magnetic memory structure and the top electrode 3102 of the first magnetic memory structure 310, and forming, on the bottom electrode 3111 of the second magnetic memory structure 311, the magnetic tunnel junction structure 327 in the second magnetic memory structure and the top electrode 3112 of the second magnetic memory structure 311.

Further referring to FIG. 7, on the basis that the fifth interconnecting structure 325 is formed in the fifth interconnecting hole 324, in an embodiment, while a pair of bottom electrodes spaced apart are formed on the second dielectric layer 305 in step S361, a second conductor layer 328 is further formed between the bottom electrodes, where the second conductor layer 328 is connected to the first conductor layer 304 through the fifth interconnecting structure 325, and a gap exists between the second conductor layer 328 and the bottom electrode; the gap between the second conductor layer 328 and the bottom electrode is filled with the third dielectric layer 308.

In the manufacturing method of a semiconductor structure provided by the foregoing embodiment, the formed second conductor layer is located in a same layer with the bottom electrode of the first magnetic memory structure, so that the second conductor layer and the bottom electrode of the first magnetic memory structure can be formed simultaneously in one process step during manufacturing of the semiconductor structure, thereby further reducing the process steps and the cost.

Further referring to FIG. 9 and FIG. 10, in an embodiment, the magnetic tunnel junction structure 327 may include, but is not limited to, a fixed layer 3271, a magnetic tunnel junction layer 3272, and a free material layer 3273 that are sequentially stacked from bottom to top.

On the basis of in the foregoing embodiments, step S364 may specifically include the following step:

As shown in FIG. 9, a fixed material layer 3271, a magnetic tunnel junction material layer 3272, a free material layer 3273, and a top electrode material layer 3277 sequentially stacked from bottom to top are formed on an upper surface of the bottom electrode.

As shown in FIG. 10, the fixed material layer 3271, the magnetic tunnel junction material layer 3272, the free material layer 3273, and the top electrode material layer 3277 sequentially stacked from bottom to top are patterned, to form the fixed layer 3274, the magnetic tunnel junction layer 3275, the free layer 3276, and the top electrode sequentially stacked from bottom to top.

The present disclosure does not limit the specific materials of the fixed material layer 3271 and the fixed layer 3274. The fixed material layer 3271 and the fixed layer 3274 each may include any one of or a laminated structure formed by more than one of a cobalt-iron-boron (CoFeB) layer, a tantalum (Ta) layer, a layer structure with stacked cobalt and platinum ($[Co(x)/Pt(y)]_n$), a ruthenium (Ru) layer or an iridium (Ir) layer. The present disclosure does not limit the specific materials of the magnetic tunnel junction material layer 3272 and the magnetic tunnel junction layer 3275. In an embodiment, the magnetic tunnel junction material layer 3272 and the magnetic tunnel junction layer 3275 each include a CoFeB layer. The present disclosure does not limit the specific materials of the free material layer 3273 and the free layer 3276. In an embodiment, the free material layer 3273 and the free layer 3276 each include magnesium oxide (MgO).

In an embodiment, as shown in FIG. 10, after step S363 of forming a magnetic tunnel junction structure 327 and a top electrode on the bottom electrode and before step S364 of forming, on the third dielectric layer 308, a fourth dielectric layer 309 that covers the bottom electrode, the method may further include a step of forming an insulation covering layer 326 on the magnetic tunnel junction structure 327 and the top electrode.

For step S37 and step S38, referring to FIG. 11 and FIG. 12, in an embodiment, as shown in FIG. 11, while the fourth interconnecting hole 314 is formed in the fifth dielectric layer 312 and the fourth dielectric layer 309 in step S37, a sixth interconnecting hole 329 is further formed in the fifth dielectric layer 312 and the fourth dielectric layer 309, and a seventh interconnecting hole 330 is further formed in the fifth dielectric layer 312. The sixth interconnecting hole 329 exposes the second conductor layer 328, and the seventh interconnecting hole 330 exposes the top electrode 3112 of the second magnetic memory structure 311. Based on the foregoing step, as shown in FIG. 12, while the third interconnecting structure 315 is formed in the third interconnecting hole 313 and the fourth interconnecting structure 316 is formed in the fourth interconnecting hole 314 in step S38, a sixth interconnecting structure 331 is further formed in the sixth interconnecting hole 329, and a seventh interconnecting structure 332 is further formed in the seventh interconnecting hole 330; while the first bit line 317 and the second bit line 318 are formed on the fifth dielectric layer 312, a third conductor layer 333 is further formed on the fifth dielectric layer 312, where the third conductor layer 333 is connected to the second conductor layer 328 through the sixth interconnecting structure 331, and connected to the top electrode 3112 of the second magnetic memory structure 311 through the seventh interconnecting structure 332.

In the manufacturing method of a semiconductor structure provided by the foregoing embodiment, the sixth interconnecting hole and the seventh interconnecting hole are formed while the fourth interconnecting hole is formed; the sixth interconnecting structure and the seventh interconnecting structure are formed while the fourth interconnecting structure is formed. In this way, during manufacturing, the fourth interconnecting hole, the sixth interconnecting hole, and the seventh interconnecting hole can be formed simultaneously in one process step; the fourth interconnecting structure, the sixth interconnecting structure, and the seventh interconnecting structure can be formed simultaneously in one process step, thereby further reducing the process steps and the cost.

In addition, in the manufacturing method of a semiconductor structure provided by the foregoing embodiment, the formed third conductor layer, first bit line, and second bit line are located in a same layer, so that during manufacturing of the semiconductor structure, the third conductor layer, the first bit line, and the second bit line can be formed simultaneously in one process step, thereby further reducing the process steps and the cost.

In an embodiment, while the first interconnecting hole 302 and the eighth interconnecting hole 319 are formed in the first dielectric layer 301, a ninth interconnecting hole is further formed in the first dielectric layer 301, where the ninth interconnecting hole exposes the control terminal of the transistor 2. Based on the foregoing step, while the first interconnecting structure 303 is formed in the first interconnecting hole 302 and the eighth interconnecting structure 320 is formed in the eighth interconnecting hole 319, a ninth interconnecting structure is formed in the ninth interconnecting hole. Based on the foregoing step, while the first conductor layer 304 and the source line are formed on the upper surface of the first dielectric layer 301, a word line is further formed on the upper surface of the first dielectric layer 301, and is connected to the control terminal of the transistor 2.

The present disclosure does not limit the specific manner of forming the first interconnecting hole 302, the second interconnecting hole 306, the third interconnecting hole 313, the fourth interconnecting hole 314, the fifth interconnecting hole 324, the sixth interconnecting hole 329, the seventh interconnecting hole 330, the eighth interconnecting hole 319 and the ninth interconnecting hole. The first interconnecting hole 302, the second interconnecting hole 306, the third interconnecting hole 313, the fourth interconnecting hole 314, the fifth interconnecting hole 324, the sixth interconnecting hole 329, the seventh interconnecting hole 330, the eighth interconnecting hole 319 and the ninth interconnecting hole may be formed using, but not limited to, the method below:

A surface of the obtained structure is coated with a photoresist; the photoresist is subject to exposure and development, and a redundant part of the photoresist is removed to form an interconnecting hole pattern; and the obtained structure is etched through, but not limited to, dry etching, to form the first interconnecting hole 302, the second interconnecting hole 306, the third interconnecting hole 313, the fourth interconnecting hole 314, the fifth interconnecting hole 324, the sixth interconnecting hole 329, the seventh interconnecting hole 330, the eighth interconnecting hole 319, and the ninth interconnecting hole.

The present disclosure does not limit the specific materials of the first interconnecting structure 303, the second interconnecting structure 307, the third interconnecting structure 315, the fourth interconnecting structure 316, the fifth interconnecting structure 325, the sixth interconnecting structure 331, the seventh interconnecting structure 332, the eighth interconnecting structure 320, the ninth interconnecting structure, the first conductor layer 304, the second conductor layer 328, and the third conductor layer 333. These interconnecting structures and conductor layers may each include, but not limited to, copper, tungsten, or other metal materials. In an embodiment, the first interconnecting structure 303, the second interconnecting structure 307, the third interconnecting structure 315, the fourth interconnecting structure 316, the fifth interconnecting structure 325, the sixth interconnecting structure 331, the seventh interconnecting structure 332, the eighth interconnecting structure 320, the ninth interconnecting structure, the first conductor layer 304, the second conductor layer 328, and the third conductor layer 333 each include tungsten, which can uniformly fill through holes with high depth-to-width ratios, and has a high melting point, high hardness, excellent corrosion resistance, and good electrical and thermal conductivity.

Figure 13:
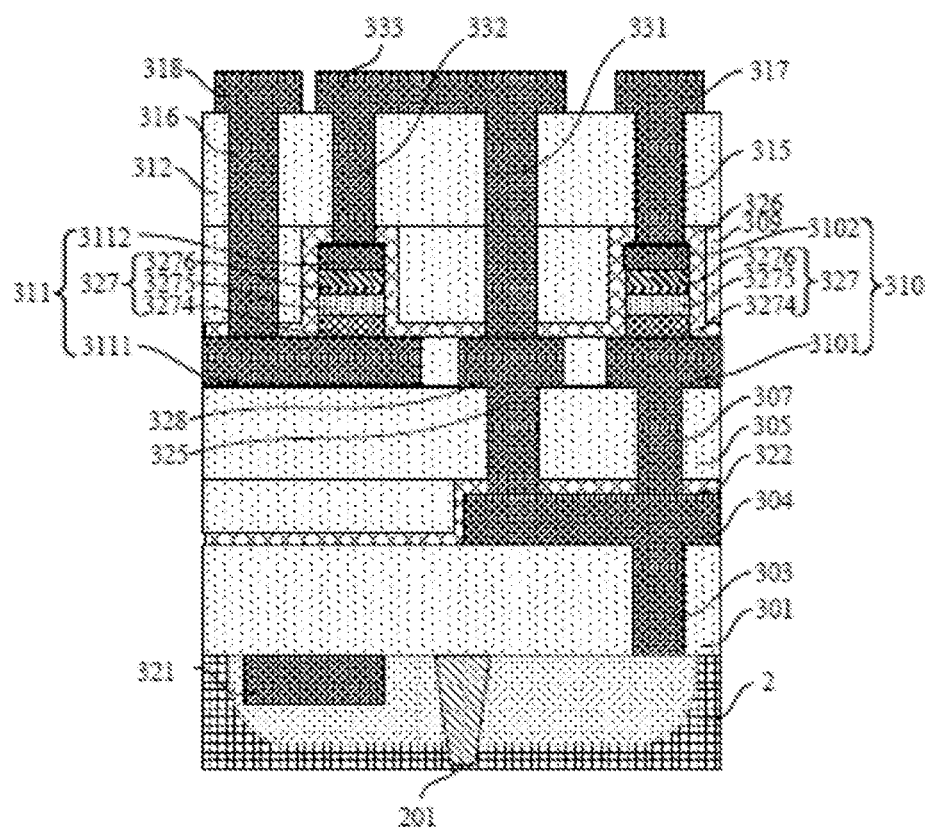
FIG. 13 is a schematic cross-sectional view of a semiconductor structure according to another embodiment of the present disclosure.

It should be noted that, in the manufacturing method of a semiconductor structure provided by the present disclosure, forms of the control terminal 201 of the transistor 2 and the selection line 321 electrically connected to the second terminal of the transistor 2 are not limited. In some possible embodiments, as shown in FIG. 13, the control terminal 201 of the transistor 2 may be buried in the substrate 1. A step of forming the transistor 2 of which the control terminal 201 is buried in the substrate 1 is described in further detail below.

In an embodiment, in the process of forming the transistor 2 in step S2, the transistor 2 may include the first terminal and the second terminal that are located in the substrate 1, and the control terminal 201 located between the first terminal and the second terminal. Based on the foregoing embodiment, the transistor 2 may be formed in, but not limited to, the following manner: forming a first trench (not shown) in the substrate 1; and forming the control terminal 201 in the first trench; and forming the first terminal and the second terminal in the substrate 1.

Further, based on the foregoing step, the selection line 321 electrically connected to the second terminal of the transistor 2 may be formed in, but not limited to, the following manner:

forming a second trench (not shown) in the second terminal of the transistor 2; and forming the selection line 321 in the second trench.

It may be understood that, the selection line 321 in the foregoing embodiment may include a source line.

It may be understood that, the transistor in the present disclosure is located in the first terminal and the second terminal of the substrate, and may include a drain doped region and a source doped region in the substrate.

Figure 2:
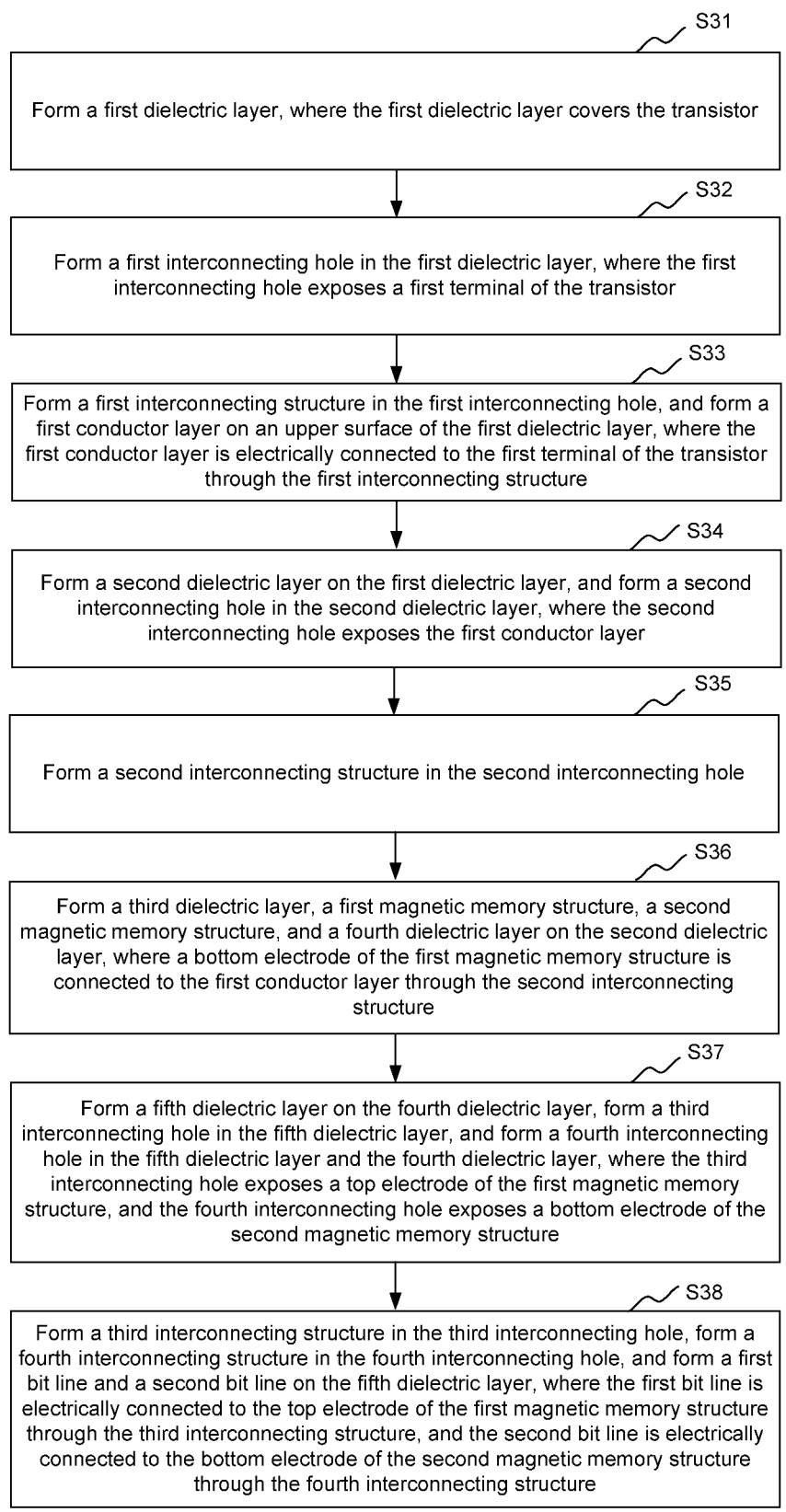
FIG. 2 is a flowchart of step S3 in the manufacturing method of a semiconductor structure according to an embodiment of the present disclosure.

It should be understood that although the steps in the flowcharts of FIG. 1, FIG. 2 and FIG. 8 are shown in turn as indicated by arrows, these steps are not necessarily performed in turn as indicated by the arrows. The execution order of these steps is not strictly limited, and these steps may be executed in other orders, unless clearly described otherwise. Moreover, at least some of the steps in FIG. 1, FIG. 2 and FIG. 8 may include a plurality of substeps or stages. The substeps or stages are not necessarily executed at the same time, but may be executed at different times. The execution order of the substeps or stages is not necessarily carried out sequentially, but may be executed alternately with other steps or at least some of the substeps or stages of other steps.

Further referring to FIG. 12, according to some embodiments, the present disclosure further provides a semiconductor structure. The semiconductor structure may specifically include a substrate (not shown in FIG. 12), a transistor 2, a first magnetic memory structure 310, a second magnetic memory structure 311, a first bit line 317, a second bit line 318, and a selection line 321.

Specifically, the transistor 2 includes a control terminal, a first terminal, and a second terminal. The first terminal and the second terminal are located in the substrate, and the control terminal is located between the first terminal and the second terminal. A bottom electrode 3101 of the first magnetic memory structure 310 is electrically connected to the first terminal of the transistor 2; a top electrode 3112 of the second magnetic memory structure 311 is electrically connected to the first terminal of the transistor 2, and a bottom electrode 3101 of the first magnetic memory structure 310 is located in a same layer with a bottom electrode 3111 of the second magnetic memory structure 311. The first bit line 317 is electrically connected to the top electrode 3102 of the first magnetic memory structure 310; the second bit line 318 is electrically connected to the bottom electrode 3111 of the second magnetic memory structure 311; and the selection line 321 is electrically connected to the second terminal of the transistor 2.

In the semiconductor structure provided by the present disclosure, a complementary structure consisting of two magnetic memory structures is formed. The first magnetic memory structure and the second magnetic memory structure may be constantly configured in complementary states (for example, the first magnetic memory structure is in a parallel state RP and the second magnetic memory structure is in an antiparallel state RAP, and vice versa), so that no external reference signal is needed, thus achieving a high read speed, a large read margin, and high reliability. Meanwhile, because the bottom electrode of the first magnetic memory structure is in the same layer with the bottom electrode of the second magnetic memory structure, during manufacturing of the semiconductor structure, the bottom electrode of the first magnetic memory structure and the bottom electrode of the second magnetic memory structure can be formed simultaneously in one process step, which reduces the process steps and the cost.

For example, when the first magnetic memory structure is used as a reference unit and the second magnetic memory structure is used as a data unit, the data unit, that is, a reverse state of the second magnetic memory structure, can be written to the reference unit, that is, the first magnetic memory structure, and compared with the paired reference units to read the data bits. In this way, the impact of the tailing bit effect on the read margin can be reduced.

In an embodiment, the control terminal is located above the substrate between the first terminal and the second terminal. Based on the foregoing embodiment, as shown in FIG. 12, the selection line 321 may be located above the second terminal; further, based on the foregoing embodiment, a height of the selection line 321 may be the same as a height of the control terminal.

Further referring to FIG. 12, in an embodiment, the semiconductor structure may further include a first conductor layer 304, a second conductor layer 328, and a third conductor layer 333.

Specifically, the first conductor layer 304 is located on the substrate, and is connected to the first terminal of the transistor 2 through the first interconnecting structure 303; the bottom electrode 3101 of the first magnetic memory structure 310 is connected to the first conductor layer 304 through the second interconnecting structure 307, and the top electrode 3102 of the first magnetic memory structure 310 is connected to the first bit line 317 through the third interconnecting structure 315. The second bit line 318 is connected to the bottom electrode 3111 of the second magnetic memory structure 311 through the fourth interconnecting structure 316. The second conductor layer 328 is located on the first conductor layer 304, and is connected to the first conductor layer 304 through the fifth interconnecting structure 325. The third conductor layer 333 is located on the second conductor layer 328, is connected to the second conductor layer 328 through the sixth interconnecting structure 331, and is connected to the top electrode 3112 of the second magnetic memory structure 311 through the seventh interconnecting structure 332.

Further referring to FIG. 12, in an embodiment, the second conductor layer 328 is located in a same layer with the bottom electrode 3101 of the first magnetic memory structure 310; the third conductor layer 333, the first bit line 317, and the second bit line 318 are located in a same layer.

In the semiconductor structure provided by the foregoing embodiment, the second conductor layer is located in the same layer with the bottom electrode of the first magnetic memory structure 310, and the third conductor layer is located in the same layer with the first bit line and the second bit line, so that during manufacturing of the semiconductor structure, the second conductor layer and the bottom electrode of the first magnetic memory structure 310 are formed simultaneously in one process step, and the third conductor layer, the first bit line, and the second bit line are formed simultaneously in one process step, thereby further reducing the process steps and the cost.

Further referring to FIG. 12, in an embodiment, the control terminal of the transistor 2 is a gate, the first terminal of the transistor 2 is a drain, the second terminal of the transistor 2 is a source, the selection line 321 is a source line, and the first conductor layer 304 is a drain line. Based on the foregoing embodiment, the source line is located in a same layer with the first conductor layer 304 and is spaced apart from the first conductor layer 304; the source line is electrically connected to the second terminal of the transistor 2 through the eighth interconnecting structure 320.

In the semiconductor structure provided by the foregoing embodiment, the source line is located in the same layer with the first conductor layer, so that during manufacturing of the semiconductor structure, the source line and the first conductor layer are formed simultaneously in one process step, thereby further reducing the process steps and the cost.

Referring to FIG. 12, in an embodiment, the first magnetic memory structure 310 and the second magnetic memory structure 311 each include a bottom electrode, a magnetic tunnel junction structure 327, and a top electrode that are sequentially stacked from bottom to top.

Specifically, the magnetic tunnel junction structure 327 may include a fixed layer 3274, a magnetic tunnel junction layer 3275, and a free layer 3276 that are sequentially stacked from bottom to top; moreover, in the first magnetic memory structure 310 and the second magnetic memory structure 311, the fixed layers 3274 are located in a same layer, the magnetic tunnel junction layers 3275 are located in a same layer, and the free layers 3276 are located in a same layer.

It may be understood that, the bottom electrode in the present disclosure may include the bottom electrode 3101 of the first magnetic memory structure 310 and the bottom electrode 3111 of the second magnetic memory structure 311; the top electrode of the present disclosure may include the top electrode 3102 of the first magnetic memory structure 310 and the top electrode 3112 of the second magnetic memory structure 311.

It should be noted that, in the semiconductor structure provided by the present disclosure, forms of the control terminal of the transistor 2 and the selection line 321 electrically connected to the second terminal of the transistor 2 are not limited. In some possible embodiments, as shown in FIG. 13, the control terminal 201 of the transistor 2 may be buried in the substrate 1. A structure of forming the transistor 2 of which the control terminal 201 is buried in the substrate 1 is described in further detail below.

Referring to FIG. 13, in an embodiment, the control terminal 201 is located on the substrate 1 between the first terminal and the second terminal. Based on the foregoing embodiment, the selection line 321 is located in the second terminal.

It should be noted that, the present disclosure does not limit the positional relationship between the bottom of the selection line 321 and the bottom of the control terminal 201. In an embodiment, the bottom of the selection line 321 may be flush with the bottom of the control terminal 201; in another possible embodiment, the bottom of the selection line 321 may alternatively be higher than the bottom of the control terminal 201.

In an embodiment, a height of the selection line 321 is the same as a height of the control terminal 201.

The technical features of the foregoing embodiments can be employed in arbitrary combinations. To provide a concise description of these examples, all possible combinations of all technical features of the embodiment may not be described; however, these combinations of technical features should be construed as disclosed in the description as long as no contradiction occurs.

Only several embodiments of the present disclosure are described in detail above, but they should not therefore be construed as limiting the scope of the present disclosure. It should be noted that those of ordinary skill in the art can further make variations and improvements without departing from the conception of the present disclosure. These variations and improvements all fall within the protection scope of the present disclosure. Therefore, the protection scope of the present disclosure should be subject to the protection scope defined by the claims.

The invention claimed is:

1. A semiconductor structure, comprising:
a substrate;
a transistor, comprising a control terminal, a first terminal, and a second terminal, wherein the first terminal and the second terminal are located in the substrate, and the control terminal is located between the first terminal and the second terminal;
a first magnetic memory structure, wherein a bottom electrode of the first magnetic memory structure is electrically connected to the first terminal of the transistor;
a second magnetic memory structure, wherein a top electrode of the second magnetic memory structure is electrically connected to the first terminal of the transistor, and the bottom electrode of the first magnetic memory structure is located in a same layer with a bottom electrode of the second magnetic memory structure;
a first bit line, electrically connected to a top electrode of the first magnetic memory structure;
a second bit line, electrically connected to the bottom electrode of the second magnetic memory structure; and
a selection line, electrically connected to the second terminal of the transistor.

2. The semiconductor structure according to claim 1, wherein the control terminal is located in the substrate between the first terminal and the second terminal, and the selection line is located in the second terminal.

3. The semiconductor structure according to claim 2, wherein a bottom of the selection line is flush with a bottom of the control terminal.

4. The semiconductor structure according to claim 3, wherein a height of the selection line is the same as a height of the control terminal.

5. The semiconductor structure according to claim 1, wherein the control terminal is located above the substrate between the first terminal and the second terminal; and
the selection line is located above the second terminal, and a height of the selection line is the same as a height of the control terminal.

6. The semiconductor structure according to claim 1, the semiconductor structure further comprises:
a first conductor layer, located on the substrate and connected to the first terminal of the transistor through a first interconnecting structure, wherein the bottom electrode of the first magnetic memory structure is connected to the first conductor layer through a second interconnecting structure, the top electrode of the first magnetic memory structure is connected to the first bit line through a third interconnecting structure, and the second bit line is connected to the bottom electrode of the second magnetic memory structure through a fourth interconnecting structure;
a second conductor layer, located on the first conductor layer, and connected to the first conductor layer through a fifth interconnecting structure; and
a third conductor layer, located on the second conductor layer, connected to the second conductor layer through a sixth interconnecting structure, and connected to the top electrode of the second magnetic memory structure through a seventh interconnecting structure.

7. The semiconductor structure according to claim 6, wherein the second conductor layer is located in a same layer with the bottom electrode of the first magnetic memory structure; and the third conductor layer, the first bit line, and the second bit line are all located in a same layer.

8. The semiconductor structure according to claim 6, wherein the control terminal of the transistor is a gate, the first terminal of the transistor is a drain, the second terminal of the transistor is a source, and the selection line is a source line, wherein
the source line is located in a same layer with the first conductor layer, and is spaced apart from the first conductor layer; the source line is electrically connected to the second terminal of the transistor through an eighth interconnecting structure.

9. The semiconductor structure according to claim 1, wherein the first magnetic memory structure and the second magnetic memory structure each comprise: the bottom electrode, a magnetic tunnel junction structure, and the top electrode that are sequentially stacked from bottom to top, wherein
the magnetic tunnel junction structure comprises: a fixed layer, a magnetic tunnel junction layer, and a free layer that are sequentially stacked from bottom to top, and in the first magnetic memory structure and the second magnetic memory structure, the fixed layers are located in a same layer, the magnetic tunnel junction layers are located in a same layer, and the free layers are located in a same layer.

10. A manufacturing method of a semiconductor structure, comprising:
providing a substrate;
forming a transistor, wherein the transistor comprises a first terminal and a second terminal that are located in the substrate, and a control terminal located between the first terminal and the second terminal;
forming a first magnetic memory structure, a second magnetic memory structure, a first bit line, and a second bit line, wherein a bottom electrode of the first magnetic memory structure is electrically connected to the first terminal of the transistor, a top electrode of the second magnetic memory structure is electrically connected to the first terminal of the transistor, the first bit line is electrically connected to a top electrode of the first magnetic memory structure, the second bit line is electrically connected to a bottom electrode of the second magnetic memory structure, and the bottom electrode of the first magnetic memory structure is located in a same layer with the bottom electrode of the second magnetic memory structure; and
forming a selection line electrically connected to the second terminal of the transistor.

11. The manufacturing method of a semiconductor structure according to claim 10, wherein the forming a transistor comprises:
forming a first trench in the substrate;
forming the control terminal in the first trench; and
forming the first terminal and the second terminal in the substrate; and the forming a selection line electrically connected to a second terminal of the transistor comprises:
forming a second trench in the second terminal; and
forming the selection line in the second trench.

12. The manufacturing method of a semiconductor structure according to claim 10, wherein the forming a first magnetic memory structure, a second magnetic memory structure, a first bit line, and a second bit line comprises:
forming a first dielectric layer, wherein the first dielectric layer covers the transistor;
forming a first interconnecting hole in the first dielectric layer, wherein the first interconnecting hole exposes the first terminal of the transistor;
forming a first interconnecting structure in the first interconnecting hole, and forming a first conductor layer on an upper surface of the first dielectric layer, wherein the first conductor layer is electrically connected to the first terminal of the transistor through the first interconnecting structure;
forming a second dielectric layer on the first dielectric layer, and forming a second interconnecting hole in the second dielectric layer, wherein the second interconnecting hole exposes the first conductor layer;
forming a second interconnecting structure in the second interconnecting hole;
forming a third dielectric layer, a first magnetic memory structure, a second magnetic memory structure, and a fourth dielectric layer on the second dielectric layer, wherein the bottom electrode of the first magnetic memory structure is connected to the first conductor layer through the second interconnecting structure;
forming a fifth dielectric layer on the fourth dielectric layer, forming a third interconnecting hole in the fifth dielectric layer, and forming a fourth interconnecting hole in the fifth dielectric layer and the fourth dielectric layer, wherein the third interconnecting hole exposes the top electrode of the first magnetic memory structure, and the fourth interconnecting hole exposes the bottom electrode of the second magnetic memory structure; and
forming a third interconnecting structure in the third interconnecting hole, forming a fourth interconnecting structure in the fourth interconnecting hole, and forming the first bit line and the second bit line on the fifth dielectric layer, wherein the first bit line is electrically connected to the top electrode of the first magnetic memory structure through the third interconnecting structure, and the second bit line is electrically connected to the bottom electrode of the second magnetic memory structure through the fourth interconnecting structure.

13. The manufacturing method of a semiconductor structure according to claim 12, wherein the forming a third dielectric layer, a first magnetic memory structure, a second magnetic memory structure, and a fourth dielectric layer on the second dielectric layer comprises:
forming a pair of bottom electrodes spaced apart on the second dielectric layer, the pair of bottom electrodes are used as the bottom electrode of the first magnetic memory structure and the bottom electrode of the second magnetic memory structure respectively;
forming a third dielectric layer on the second dielectric layer, wherein the bottom electrode of the first magnetic memory structure and the bottom electrode of the second magnetic memory structure are both located in the third dielectric layer;
forming a magnetic tunnel junction structure and a top electrode on the bottom electrode; and
forming a fourth dielectric layer on the third dielectric layer, wherein the fourth dielectric layer covers the bottom electrode.

14. The manufacturing method of a semiconductor structure according to claim 13, wherein the magnetic tunnel junction structure comprises: a fixed layer, a magnetic tunnel junction layer, and a free layer that are sequentially stacked from bottom to top;
the forming a magnetic tunnel junction structure and a top electrode on the bottom electrode comprises:
forming, on an upper surface of the bottom electrode, a fixed material layer, a magnetic tunnel junction material layer, a free material layer, and a top electrode material layer that are sequentially stacked from bottom to top; and
patterning the fixed material layer, the magnetic tunnel junction material layer, the free material layer, and the top electrode material layer that are sequentially stacked from bottom to top, to obtain a fixed layer, a magnetic tunnel junction layer, a free layer, and a top electrode that are sequentially stacked from bottom to top.

15. The manufacturing method of a semiconductor structure according to claim 13, wherein while the second interconnecting hole is formed in the second dielectric layer, a fifth interconnecting hole is further formed in the second dielectric layer; while the second interconnecting structure is formed in the second interconnecting hole, a fifth interconnecting structure is further formed in the fifth interconnecting hole;
while a pair of bottom electrodes spaced apart are formed on the second dielectric layer, a second conductor layer is further formed between the bottom electrodes, wherein the second conductor layer is connected to the first conductor layer through the fifth interconnecting structure, a gap exists between the second conductor layer and the bottom electrode, and the gap between the second conductor layer and the bottom electrode is filled with the third dielectric layer;
while the fourth interconnecting hole is formed in the fifth dielectric layer and the fourth dielectric layer, a sixth interconnecting hole is further formed in the fifth dielectric layer and the fourth dielectric layer, and a seventh interconnecting hole is formed in the fifth dielectric layer, wherein the sixth interconnecting hole exposes the second conductor layer, and the seventh interconnecting hole exposes the top electrode of the second magnetic memory structure; while the third interconnecting structure is formed in the third interconnecting hole and the fourth interconnecting structure is formed in the fourth interconnecting hole, a sixth interconnecting structure is further formed in the sixth interconnecting hole, and a seventh interconnecting structure is formed in the seventh interconnecting hole; while the first bit line and the second bit line are formed on the fifth dielectric layer, a third conductor layer is further formed on the fifth dielectric layer, wherein the third conductor layer is connected to the second conductor layer through the sixth interconnecting structure, and is connected to the top electrode of the second magnetic memory structure through the seventh interconnecting structure.

16. The manufacturing method of a semiconductor structure according to claim 15, wherein the control terminal of the transistor is a gate, the first terminal of the transistor is a drain, the second terminal of the transistor is a source, and the selection line is a source line;

while the first interconnecting hole is formed in the first dielectric layer, an eighth interconnecting hole is further formed in the first dielectric layer, wherein the eighth interconnecting hole exposes the second terminal of the transistor;

while the first interconnecting structure is formed in the first interconnecting hole, an eighth interconnecting structure is further formed in the eighth interconnecting hole; and while the first conductor layer is formed on the upper surface of the first dielectric layer, a source line is further formed on the upper surface of the first dielectric layer, wherein the source line is electrically connected to the second terminal of the transistor through the eighth interconnecting structure, and a gap exists between the source line and the first conductor layer.

17. The manufacturing method of a semiconductor structure according to claim 16, wherein after forming the source line and the first conductor layer and before forming the second dielectric layer, the method further comprises:

forming an etching stop layer on the source line, the first conductor layer, and an exposed portion of the first dielectric layer.

18. The manufacturing method of a semiconductor structure according to claim 17, wherein after forming the etching stop layer and before forming the second dielectric layer, the method further comprises:

forming a dielectric filler layer on an upper surface of the etching stop layer between the source line and the first conductor layer, wherein the gap between the source line and the first conductor layer is filled with the dielectric filler layer.

19. The manufacturing method of a semiconductor structure according to claim 17, wherein while the first interconnecting hole and the eighth interconnecting hole are formed in the first dielectric layer, a ninth interconnecting hole is formed in the first dielectric layer, wherein the ninth interconnecting hole exposes the control terminal of the transistor;

while the first interconnecting structure is formed in the first interconnecting hole and the eighth interconnecting structure is formed in the eighth interconnecting hole, a ninth interconnecting structure is further formed in the ninth interconnecting hole; and while the first conductor layer and the source line are formed on the upper surface of the first dielectric layer, a word line is further formed on the upper surface of the first dielectric layer, wherein the word line is connected to the control terminal of the transistor.

* * * * *